(12) United States Patent
Bartsch et al.

(10) Patent No.: US 9,397,285 B2
(45) Date of Patent: Jul. 19, 2016

(54) JUNCTIONLESS NANO-ELECTRO-MECHANICAL RESONANT TRANSISTOR

(71) Applicant: ECOLE POLYTECHNIQUE FEDERALE DE LAUSANNE (EPFL), Lausanne (CH)

(72) Inventors: Sebastian Thimotee Bartsch, Lausanne (CH); Mihai Adrian Ionescu, Ecublens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/395,626

(22) PCT Filed: Apr. 19, 2013

(86) PCT No.: PCT/IB2013/053113
§ 371 (c)(1),
(2) Date: Oct. 20, 2014

(87) PCT Pub. No.: WO2013/156978
PCT Pub. Date: Oct. 24, 2013

(65) Prior Publication Data
US 2015/0137068 A1 May 21, 2015

(30) Foreign Application Priority Data

Apr. 19, 2012 (EP) .................................. 12164756

(51) Int. Cl.
*H01L 41/09* (2006.01)
*H01L 41/113* (2006.01)
(Continued)

(52) U.S. Cl.
CPC .......... *H01L 41/0966* (2013.01); *B81B 3/0021* (2013.01); *B82Y 15/00* (2013.01);
(Continued)

(58) Field of Classification Search
CPC . G01P 15/08; G01P 15/0805; G01P 15/0808; G01P 15/0814; G01P 15/0817; G01P 15/082; G01P 15/097; G01P 15/12; G01P 15/123; G01P 15/124; G01P 15/125; H01H 57/006; H01H 59/0009; H01H 59/00036; B82Y 15/00; H01L 29/84; H01L 41/0933; H01L 41/093; H01L 41/0966; H01L 41/113; H01L 41/1132; H01L 41/1134
See application file for complete search history.

(56) References Cited

U.S. PATENT DOCUMENTS

2010/0140066 A1\* 6/2010 Feng et al. .................... 200/181
2010/0171569 A1\* 7/2010 Ionescu et al. ................ 333/185
(Continued)

OTHER PUBLICATIONS

B. Lassagne, et al: "Ultrasensitive Mass Sensing with a Nanotube Electromechanical Resonator", American Chemical Society, vol. 8, No. 11, 2008, pp. 3735-3738.
(Continued)

*Primary Examiner* — Eduardo A Rodela
(74) *Attorney, Agent, or Firm* — Nixon & Vanderhye P.C.

(57) ABSTRACT

A junctionless Nano-Electro-Mechanical (NEM) resonator, comprising a highly doped conductive channel connecting a drain region and a source region; the conduction channel region is movable and the overall structure is fixed at least at these two ends placed on acting the source and drain regions, respectively; at least one fixed gate electrode arranged to control a depletion charge in the highly doped conductive channel thereby modulating dimensions of a cross-section of the highly doped conductive channel. A dimension of the cross-section in the direction of an electrical field that is oriented from the fixed gate electrode to the highly doped conductive channel, is designed in such a way that it can be reduced under the effect of the depletion charge such that a full depletion in the highly doped conductive channel is achievable with the control of the fixed gate electrode.

16 Claims, 8 Drawing Sheets

(51) Int. Cl.
H01H 59/00 (2006.01)
B82Y 15/00 (2011.01)
H03H 9/02 (2006.01)
H03H 9/24 (2006.01)
B81B 3/00 (2006.01)

(52) U.S. Cl.
CPC ....... *H01H59/0009* (2013.01); *H01L 41/0933* (2013.01); *H01L 41/1134* (2013.01); *H03H 9/02259* (2013.01); *H03H 9/24* (2013.01); *H03H 9/2463* (2013.01); *B81B 2201/01* (2013.01); *B81B 2201/0235* (2013.01); *B81B 2201/0242* (2013.01); *B81B 2201/0264* (2013.01); *B81B 2201/0271* (2013.01); *B81B 2201/0278* (2013.01); *H03H 2009/02314* (2013.01)

(56) References Cited

U.S. PATENT DOCUMENTS

| | | | | |
|---|---|---|---|---|
| 2010/0276662 | A1* | 11/2010 | Colinge | 257/9 |
| 2011/0067982 | A1* | 3/2011 | Schmit et al. | 200/181 |
| 2011/0298553 | A1* | 12/2011 | Ionescu et al. | 331/154 |
| 2014/0203796 | A1* | 7/2014 | Mohammadi et al. | 324/76.11 |
| 2014/0262707 | A1* | 9/2014 | Pawashe et al. | 200/181 |

OTHER PUBLICATIONS

H.J. Mamin, et al: "Sub-attonewton force detection at millikelvin temperatures", Applied Physics Letters, vol. 79, No. 20, Nov. 12, 2001, pp. 3358-3360.
Mo Li, H.X. Tang, etal: "Ultra-sensitive NEMS-based cantilevers for sensing, scanned probe and very high-frequency applications", published online Jan. 28, 2007, pp. 114-119.
A.K. Naik, et al: "Towards single-molecule nanomechanical mass spectrometry", Published online Jun. 21, 2009; "Nature Nanotechnology", vol. 4, Jul. 2009; pp. 445-449.
Ndieyira, et al, "White Rose Research online", Universities of Leeds, Sheffield and York http://eprints.whiterose.ac.uk/, Nature Nanotechnology White Rose Research Online URL for this paper: http://eprints.whiterose.ac.uk/id/eprint/75723, pp. 1-23.
X.L. Feng, et al: "A self-sustaining ultrahigh-frequency nanoelectromechanical oscillator", Published online: May 25, 2008; doi:10.1038/nnano.2008.125, Published online: May 25, 2008; doi:10.1038/nnano.2008.125, pp. 343-345.
Patrick A. Truitt, et al: "Efficient and Sensitive Capacitive Readout of Nanomechanical Resonator Arrays", © 2007 "American Chemical Society", Nano letters 2007, vol. 7, No. 1, pp. 120-126.
X.L. Feng, et al: Very High Frequency Silicon Nanowire Electromechanical Resonators, © 2007 "American Chemical Society", Nano Letters 2007, vol. 7, No. 7, pp. 1953-1959.
Nipun Sinha, et al: "Piezoelectric aluminum nitride nanoelectromechanical actuators", AIP Applied Physics Letters , http://scitation.aip.org/content/aip/journal/apl?ver=pdfcov, © 2009 American Institute of Physics.
Mo Li, et al: "Broadband all-photonic transduction of Nanocantilevers", Nature Nanotechnology, Letters Published Online: Apr. 26, 2009, vol. 4, Jun. 2009, www.nature.com/naturenanotechnology, pp. 377-381.
Vera Sazonova, et al: "A tunable carbon nanotube electromechanical oscillator", Laboratory of Atomic and Solid-State Physics, Cornell University, Ithaca, New York 14853, USA, pp. 1-12.
Changyo Chen, "Performance of monolayer graphene nanomechanical resonators with electrical readout", Nature Nanotechnology, vol. 4, Dec. 2009, http://www.nature.com/doifinder/10.1038/nnano.2009.267, pp. 861-867.
K.L. Ekinci, et al, "Nanoelectromechanical systems", Review of Scientific Instruments 76, 061101s2005d, 2005 American Institute of Physics.

Y.T. Yang, "Zeptogram-Scale Nanomechanical Mass Sensing", vol. 6, No. 4, Apr. 2006, American Chemical Society, pp. 583-585.
J.L. Arlett, "Comparative advantages of mechanical biosensors", Nature Nanotechnology; vol. 6, Apr. 201, www.nature.com/naturenanotechnology, pp. 203-215.
Johnathan M. Rothberg, et al, "An integrated semiconductor device enabling non-optical genome sequencing", Nature, vol. 475, Jul. 21, 2011, pp. 348-351.
Rongrui He, et al, "Self-Transducing Silicon Nanowire Electromechanical Systems at Room Temperature", Nano Letters 2008, vol. 8, No. 6, pp. 1756-1761.
E. Mile et al, "In-plane nanoelectromechanical resonators based on silicon nanowire piezoresistive detection", Condensed Matter Physics 114-36, California Institute of Technology, Pasadena, California 91125, pp. 1-17.
Jean-Pierre Colinge, et al., "Nanowire transistors without junctions", Nature Nanotechnology, Advance Online Publication, Feb. 21, 2010, http://www.nature.com/doifinder/10.1038/nnano.2010.15, pp. 1-5.
Daniel Grogg, et al., "The Vibrating Body Transistor", IEEE Transactions on Electron Devices, vol. 58, No. 7, Jul. 2011, pp. 2113-2121.
Sebastian T. Bartsch, "Nanomechanical Silicon Resonators with Intrinsic Tunable Gain and Sub-nW Power Consumption", Article 2012, Nanoelectronic Devices Laboratory, vol. 6, No. 1, pp. 256-264.
Dana Weinstein, et al, "The Resonant Body Transistor", 2010 American Chemical Society, Nano letters, pp. 1234-1237, The Resonant Body Transistor Supporting Information De-embedding procedure for RBT measurement.
Steve P. Beeby, et al, "Micromachined Silicon Resonant Strain Gauges Fabricated Using SOI Wafer Technology", Journal of Microelectromechanical Systems, vol. 9, No. 1, Mar. 2000, pp. 104-111.
Vincent Gouttenoire, et al., "Digital and FM demodulation of a doubly-clamped single wall carbon nanotube oscillator: towards a nanotube cell phone", Lyon University, pp. 1-14.
Alexander Eichler, "Parametric amplification and self-oscillation in a nanotube mechanical resonator", Catalan Institute of Nanotechnology, pp. 1-20.
A. Husain, et al., Nanowire-based very-high-frequency electromechanical resonator, Applied Physics Letters, vol. 83, No. 6, Aug. 11, 2003, pp. 1240-1242.
Kun Wang,et al., "VHF Free-Free Beam High-Q Micromechanical Resonators", Journal of Microelectrromechanical Systems, vol. 9, No. 3, Sep. 2000, pp. 347-360.
J. Zhang, et al., "Rapid and label-free nanomechanical detection of biomarker transcripts in human RNA", Articles, Published online: Nov. 26, 2006; doi:10.1038/nnano.2006.134, nature nanotechnology 214, vol. 1, Dec. 2006, www.nature.com/naturenanotechnology, pp. 214-220.
Mo Li et al., "Nanoelectromechanical Resonator Arrays for Ultrafast, Gas-Phase Chromatographic Chemical Analysis", Nano Letters, 2010 American Chemical Society, pp. 3899-3903.
N. Abelé et al., "Suspended-Gate MOSFET: bringing new MEMS functionality into solid-state MOS transistor", 2005 IEEE, pp. 1-3.
International Search Report for PCT/IB2013/053113 mailed Nov. 15, 2013, 4 pages.
Written Opinion of the ISA for PCT/IB2013/053113 mailed Nov. 15, 2013, 6 pages.
Mizuta et al., "Silicon nanowires for advanced sensing: Electrical and electromechanical characteristics and functionalisation technology", *G-COE PICE International Symposium and IEEE EDS Minicolloquium on Advanced Hybrid Nano Devices*, 2011, 30 pages.
Colinge et al., "Nanowire transistors without junctions", *Nature Nanotechnology*, vol. 5, No. 3, Mar. 1, 2010, pp. 225-229.
Grogg et al., "The vibrating body transistor", *IEEE T Electron DEV*, vol. 58, 2011, pp. 2113-2121.
Grogg et al., "Multi-gate vibrating-body field effect transistor (VB-FETs)", *IEEE International Electron Devices Meeting*, Dec. 15, 2008, pp. 1-4.

* cited by examiner

JUNCTIONLESS NANO-ELECTRO-MECHANICAL RESONANT TRANSISTOR

This application is the U.S. national phase of International Application No. PCT/IB2013/053113 filed 19 Apr. 2013 which designated the U.S. and claims priority to EP Patent Application No. 12164756.4 filed 19 Apr. 2012, the entire contents of each of which are hereby incorporated by reference.

FIELD OF THE INVENTION

The present invention concerns the field of integrated transduction of nano-electro-mechanical resonators by means of junctionless field effect transistor(s).

BACKGROUND OF THE INVENTION

In the past decade, Nano-ElectroMechanical Systems (NEMS) have been gaining increasing attention for their superb ability to detect mass and force on the atomic scale.[1-3] The development of sensors based on large-scale integrated NEMS is likely to open up a broad spectrum of applications in science and technology and revolutionize a range of fields from mass spectrometry[4] to biomedical diagnostics.[5] In the present specification, a novel transduction principle in a silicon nanowire electromechanical resonator is shown, which exploits the depletion charge modulation in the self-aligned, junctionless Field Effect Transistor (FET) body as an intrinsic displacement transducer. A mechanical resonance at the very high frequency of 226 MHz is detected in the drain current of the highly doped silicon wire with a cross section of 28×35 $nm^2$. The signal gain and tunability inherent to this device can be harnessed to build nano-oscillators,[6] which can be integrated to high densities in silicon-on-insulator (SOI) complementary metal-oxide semiconductor (CMOS) conventional technology and therefore offer unique opportunities for NEMS-based sensor and signal processing systems hybridized with CMOS circuitry on a single chip.

All existing NEMS are based on a mechanical transducer, i.e., an input and output element that converts a form of energy into mechanical motion, and vice versa. Numerous mechanisms have been introduced, including electrostatic,[7] electromagnetic,[8] piezoelectric[9] or optical[10] schemes, among others, which can be combined for mechanical actuation and motion detection. In the last decade, mechanical resonators have undergone a continuous reduction in dimensions, reaching molecular levels in the form of carbon nanotubes or graphene[11-12] One reason for this development is that NEMS, because of their inherent properties as mechanical sensors, tremendously benefit from size reduction.[13] The detection of mass and force in the attogram ($10^{-18}$ g)— and attonewton ($10^{-18}$N)— range, respectively, has been repeatedly demonstrated[1, 2, 14] To unfold the full potential of these resonators, fabricating and controlling a very large ensemble of NEMS that comprise tens of thousands of resonators, is necessary. Large area technologies that enable the parallel processing of mass information have a great impact on the development in several fields,[15] such as system biology, where the parallel operation of millions of FET-based sensors recently enabled non-optical genome sequencing on-chip.[16] In terms of NEMS, these requirements severely limit the choice of material and of the type of mechanical transducer. Silicon technology remains therefore a promising avenue to follow for NEMS-based systems targeting a high level of integration and complexity. The piezoresistive effect in silicon has been exploited in nanowire resonators operating at very high operating frequencies. However, transduction schemes employed therein required a detection circuitry involving frequency generation at twice the resonator's natural frequency,[17] or a complex modal shape design of so-called crossbar cantilevers.[18]

SUMMARY OF INVENTION

The present description addresses the creation of electromechanical resonators in form of highly doped, suspended silicon nanowires that exploit the intrinsic gain in a junctionless FET to transduce mechanical motion up to very high frequencies (up to a few gigahertz), such as for example 224 MHz demonstrated in the experimental on-chip prototype.

Accordingly, the present invention concerns a mechanical resonator having at least a highly doped moving part which is fixed by at least two ends, at least one electrode to control the depletion charge in said moving part, whereby the size of the doped part of the moving part in the direction of the electrical field is reduced to such dimension that full depletion is achievable with the action of said electrode.

In a first aspect the invention provides a junctionless Nano-Electro-Mechanical (NEM) resonator, comprising a highly doped conductive channel connecting a drain and a source electrode and movably fixed by at least two ends acting as said source and drain electrodes, respectively; at least one fixed gate electrode arranged to control a depletion charge in the highly doped conductive channel thereby modulating dimensions of a cross-section of the highly doped conductive channel. A dimension of the cross-section in the direction of an electrical field that is oriented from the fixed gate electrode to the highly doped conductive channel, is designed in such a way that it can be reduced under the effect of the depletion charge such that a full depletion in the highly doped conductive channel is achievable with the control of the fixed gate electrode.

In a first preferred embodiment the highly doped conductive channel is one out of the following list: a nano-beam, a nano-wire, a nano-plate, a nano-disk, a nano-membrane.

In a second preferred embodiment the highly doped conductive channel or the at least one gate electrode comprises a thermal silicon oxide layer positioned at an interface between the highly doped conductive channel and the at least one fixed gate electrode.

In a third preferred embodiment, a volume between the highly doped conductive channel and the at least one fixed gate electrode is partially or totally filled by the thermal silicon oxide layer.

In a fourth preferred embodiment, the highly doped conductive channel and/or the at least one gate comprise a surface that was treated through thermal oxidation for passivation, temperature compensation or functionalization.

In a fifth preferred embodiment, the junctionless NEM resonator further comprises at least an additional highly doped conductive channel, wherein the highly doped conductive channel and the least one additional highly doped conductive channel are mechanically coupled to each other through elastic fixations.

In a sixth preferred embodiment, the at least one fixed gate electrode gate comprises two fixed gates electrodes arranged to independently couple to the highly doped conductive channel.

In a seventh preferred embodiment, the at least one gate electrode is made of one out of the following list: highly doped p+ single crystalline silicon, highly doped n+ single crystalline silicon, other semiconductor material, poly-silicon, metal silicide, a metal.

In an eighth preferred embodiment, the highly doped conductive channel has a doping concentration of substantially equal to or greater than $2 \times 10^{18}$ cm$^{-3}$.

In a ninth preferred embodiment, the dimension of the cross-section in the direction of the electrical field that is oriented from the fixed gate electrode to the highly doped conductive channel, in an absence of a depletion charge is substantially 35 nm.

In a tenth preferred embodiment, the highly doped conductive channel is positioned over a bulk silicon substrate.

In an eleventh preferred embodiment, the highly doped conductive channel is positioned over an electrically isolated substrate.

In a second aspect the invention provides a junctionless Nano-Electro-Mechanical (NEM) mixer-filter comprising at least one junctionless NEM resonator wherein a filter shape is given by a mechanical spectrum of the junctionless NEM resonator and wherein the control of the depletion charge in the highly conductive channel generates a current-voltage nonlinearity upon which a mixing of a first signal and a second signals of different frequency is made possible. The first signal (RF) and the second signal (LO) are applied according to
(i) the first signal (RF) on the gate, the second signal (LO) on the drain (source)
(ii) the first signal (RF) and the second signal (LO) to the gate, A DC bias at the drain (source) is zero in case of a resistive mixing or non-zero is case of an active mixing.

In a third aspect the invention provides a junctionless Nano-Electro-Mechanical (NEM) frequency demodulator comprising at least one junctionless NEM resonator wherein a frequency-modulated carrier signal is demodulated and a based-band is recovered via a combination of the mechanical spectral response of the NEM resonator with the said depletion-charge induced current-voltage nonlinearity in the highly doped conductive channel.

In a fourth aspect the invention provides a junctionless Nano-Electro-Mechanical (NEM) resonator phase-locked loop comprising at least one junctionless NEM resonator, wherein the property of the junctionless NEM as mixer-filter or as frequency demodulator is used to generate a negative feedback signal with improved signal-to-noise and to realize a phase-locked loop tracking the NEM mechanical oscillation in real-time.

In a fifth aspect the invention provides a junctionless Nano-Electro-Mechanical (NEM) electromechanical oscillator comprising at least one junctionless NEM resonator, wherein a frequency determining element is given by a junctionless NEM resonator mechanical design, and wherein the gate controls the depletion charge and so the current in the highly conductive channel, thereby generating an intrinsic voltage or transconductance amplification which is used to partially sustain the mechanical oscillation in a self-sustained closed loop configuration, or fully sustain the mechanical oscillation in a self-oscillating configuration.

In a sixth aspect the invention provides a junctionless Nano-Electro-Mechanical (NEM) resonator sensor comprising at least one junctionless NEM resonator, wherein the physical quantity to be measured is displacement, mass, acceleration, torque, heat, temperature, pressure, or else, wherein the dependency on the frequency, the quality factor or the output signal of the junctionless NEM resonator is known, wherein the said intrinsic signal amplification is exploited to enhance the sensor's output signal-to-noise ratio.

BRIEF DESCRIPTION OF THE DRAWINGS

The invention will be better understood through the description of preferred embodiments and in reference to the figures, wherein.

DETAILED DESCRIPTION OF PREFERRED EMBODIMENTS

Figure 1:
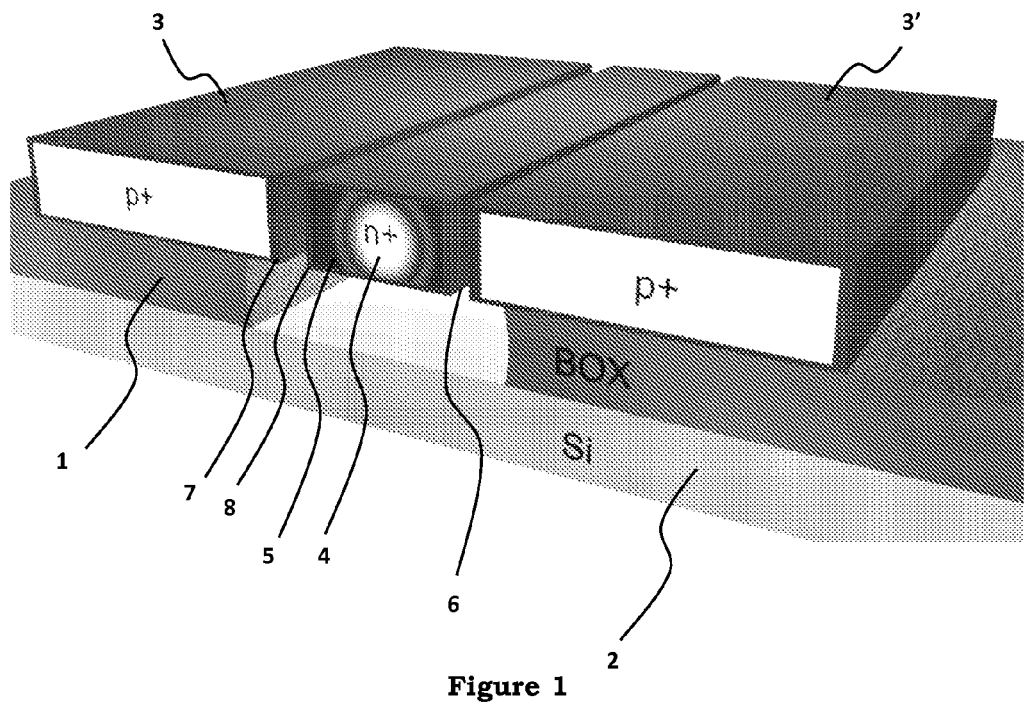
FIG. 1 contains a three dimensional view of an example embodiment of a device according to the invention.

A novel transduction principle in a silicon nanowire electromechanical resonator is obtained by exploiting the depletion charge modulation in a self-aligned, junctionless transistor as an intrinsic displacement transducer. A mechanical resonance at the very high frequency of 226 MHz is detected in the drain current of the highly doped silicon wire with a cross-section of only 28×35 nm$^2$. In contrast, the transduction mechanism proposed in the present application implies:
(i) a fundamental simplification in the detection of the mechanical resonance of truly nano-scale, highly doped silicon resonators. So far, piezoresistance in silicon nanowires has been utilized to transduce rather lightly doped mechanical resonators, which required detection circuitry involving frequency generation at twice the resonator's natural frequency. The trade-off between efficient piezoresistive effect (low doping concentration) and good conductance (high doping concentration) is avoided. The doping concentration can be chosen arbitrarily high, in contrast to reference §C. Whether the junctionless transduction principle is applicable depends on resonator dimensions only. The junctionless principle is the same as described in references §A, §B, however, with focus on creating a transistor, whereas the focus here lays on creating a transduction principle for a mechanical resonator;

(ii) a fundamental simplification in the fabrication process, as the process is self-aligning and does not involve the formation of a semiconductor junction, when compared to any mechanical resonator involving the formation of a suspended transistor body or of a semiconductor junction reported to date, in contrast to reference §C. The junctionless structure eliminates the effect of junction diffusion, as described in references §A, §B, however, here with focus on a resonator, in contrast to references §A, §B. This greatly improves the thermal budget available during the parallel CMOS process on-chip;

(iii) full transistor functionality implemented in a nanowire mechanical resonator at scales below 50 nm. The resonator maintains high tunability, e.g., with respect to signal gain, motional impedance or level of power consumption. The transduction principle is not limited by further dimensional reduction, following a similar argumentation as in references §A, B, but opposed to reference §C, where the formation of a junction, of whatever type, faces limitation of engineering nature (fabrication) and fundamental nature (doping diffusion, doping fluctuation);

(iv) the signal processing based on the transistor can be utilized to provide a feedback mechanism when embedding silicon nanowire resonators in closed loops. The small-signal transistor gain can be harnessed to compensate for mechanical or other losses and simplify sustaining electronics. Heterodyne and homo-dyne mixing of signals can be used to provide a low noise feedback signal to a reference oscillator and allows implementation of frequency tracking loops;

(v) this type of nano-electromechanical system is integrated in silicon-on-insulator (SOI) complementary metal-oxide semiconductor (CMOS) conventional technology, which offers unique opportunities for hybridization with CMOS circuitry on a single chip. It can be therefore used as fundamental unit to build oscillators with very low power consumption, which can be arranged in dense arrays reaching attogram mass resolution—a range highly attractive for miniaturized environmental gas-sensor and neutral species mass-spectrometry systems.

REFERENCES §A, §B AND §C MENTIONED ABOVE

[A] EP2161755 A1, Junctionless Metal-Oxide-Semiconductor Transistor, Inventor: COLIGNE JEAN-PIERRE
[B] WO2011101463 A1, A Transistor Device, Inventor: COLINGE JEAN-PIERRE
[C] WO2010058351 A1, Active Multi Gate Micro-electromechanical device with built-in transistor, Inventor: IONESCU MIHAI ADRIAN [CH]; GROGG DANIEL [CH]

In the present specification, the notion of fixed (as in "a moving part which is fixed by at least two ends") implies a mechanically elastic fixation, which can be for example: free, guided, pinned, clamped, anchored etc.

Further, in the present specification, the control (as in "one electrode to control the depletion charge in said moving part") refers to the charge control within the silicon volume via the electrostatic field effect.

A junctionless field effect transistor has been proposed as a digital switch by Colinge et al.[19] suitable for addressing the scaling challenges of multi-gate (nanowire) transistors that arise in terms of engineering super-abrupt junction profiles for high performance FETs on nanometer-thin films. Such devices are highly doped and the ON-state is characterized by a conduction channel in the entire silicon body; by applying a gate bias, the conduction channel can be depleted, and eventually pinch-off the conduction path (OFF-state). According to Colinge et al.[19] the values of high doping in junctionless transistors range from a few $10^{18}$ cm$^{-3}$ to a few $101^{9}$ cm$^{-3}$. This type of transistor has never been proposed as electromechanical transducer.

In the present description the term high doping is meant to refer to the range of a few $10^{18}$ cm$^{-3}$ to a few $10^{19}$ cm$^{-3}$.

FIG. 1 presents an exemplary and schematic illustration of the device according to the invention and its operating principle. In the static regime, the drain current in a junctionless transistor consisting of a highly n-doped nanowire body with lateral gates is given by the expression:

$$I_D = q\mu N_D \frac{t_{Si}(W_{Si} - 2W_{dep}(V_G))}{L} V_D \quad (\text{eq. 1})$$

where $W_{Si}$ is the body (lateral) width, $N_D$ the channel doping concentration, $t_{Si}$ the channel thickness and L the channel lengths. The depletion width $W_{dep}$ is controlled by the gate voltage and varies at mechanical resonance, thereby modulating the drain current. This is in total contrast with the previously reported resonant body and resonant gate FET,[20-23] where the carrier density in inversion or accumulation layers was modulated to create a low resistivity path in a high resistivity channel region. The transconductance of the junctionless transistor can be then derived as:

$$g_m = \frac{-2q\mu N_D t_{Si} V_D}{L} \frac{dW_{dep}}{dV_G} \quad (\text{eq. 2})$$

The electromechanical current modulation due to the field effect is composed of
(i) the modulation of the depletion charge that results from applying an a.c. voltage and maintaining a constant gap, and
(ii) its modulation due to the time-varying gap under constant gate voltage.

The total current modulation in the FET in linear operation can be expressed, without loss of generality, as:[11,21]

$$i_{FET} = \partial I_D \approx g_m\left(\tilde{v}_g + \frac{C'_{eq}}{C_{eq}} \cdot \tilde{z} \cdot V_G\right) \quad (\text{eq. 3})$$

where $C_{eq}$ is the equivalent gate capacitance, $C'_{eq}$ its derivative with respect to the nanowire position, $\tilde{v}_g$ the a.c. voltage and z the (time-varying) motion of the nanowire.

The key to fabricating a junctionless NEM resonator is to form a suspended, crystalline silicon structure that is sufficiently thin to fully deplete the transistor channel via the action one or two gate electrode. Because there exists a maximum depletion width in a MOS system, a limit on the channel profile thus exists, otherwise the transistor cannot be turned off. This condition is bound by a combination of the silicon body width and the doping concentration [Sze, S. M., *Physics of Semiconductor Devices*; J. Wiley & Sons: Hoboken (New Jersey), 3rd Edition, 2007, pp. 326-327]. The maximum silicon body width $W_{si,max}$ for a double-gate, junctionless resonant-body FET becomes:

$$W_{si,max} \leq 2W_{depl,max} \cong 2\sqrt{\frac{4\varepsilon kT}{q^2 N_D} \ln \frac{N_D}{n_i}} \quad (eq.\ 4)$$

where $\varepsilon$ is the permittivity, k the Boltzmann constant, T the temperature, q the electron elementary charge, and $n_i$ the intrinsic impurity concentration. Therefore, the transduction principle we propose here is suited solely for a class of ultra-thin silicon resonators and not limited by further dimensional scaling.

In a preferred embodiment, a 35 nm thin device layer on 8" inch SOI wafers is used to fabricate NEMS based on a typical SOI-release process.[24] The conventional technology readily allows the integration of large arrays of devices with high densities. After two ion implantations with boron (p+) and phosphorus (n+), which define the gate (>1×10$^{20}$ cm$^{-3}$) and the channel doping concentration (~2×10$^{18}$ cm$^{-3}$), respectively, the NEMS active area is patterned using a hybrid DUV/e-beam lithography. A structural resolution and lithographic alignment better than 50 nm is achieved throughout the wafer. After release, the nanowire resonators were terminated with a 12 nm thermal oxide, which ensures a low leakage current and improves electromechanical coupling. It is found that, when it comes to fabricating integrated resonators with lateral air-gaps, the junctionless architecture offers the great advantage of enabling self-aligned processes, given that the gate electrodes are specific to the NEM resonator and simultaneously define the transistor channel. This implies that the junctionless FET can simplify the entire fabrication, compared to any electromechanical resonator, involving the formation of a suspended transistor body or semiconducting junction previously reported.[20-23]

Figure 2:
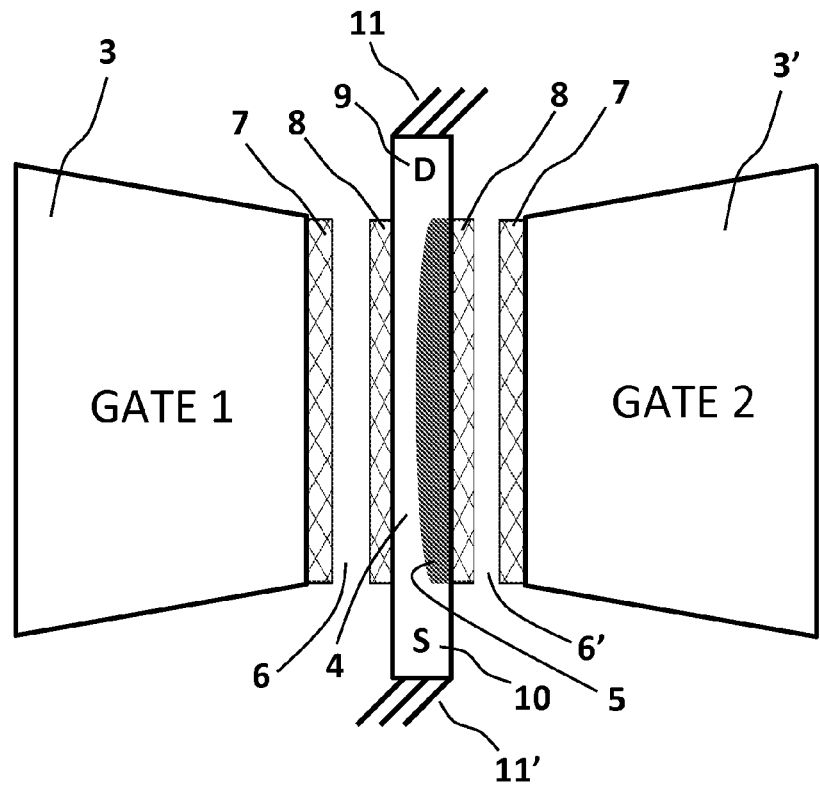
FIG. 2 contains a top view of the possible architecture of the junctionless NEM resonator.
Figure 3:
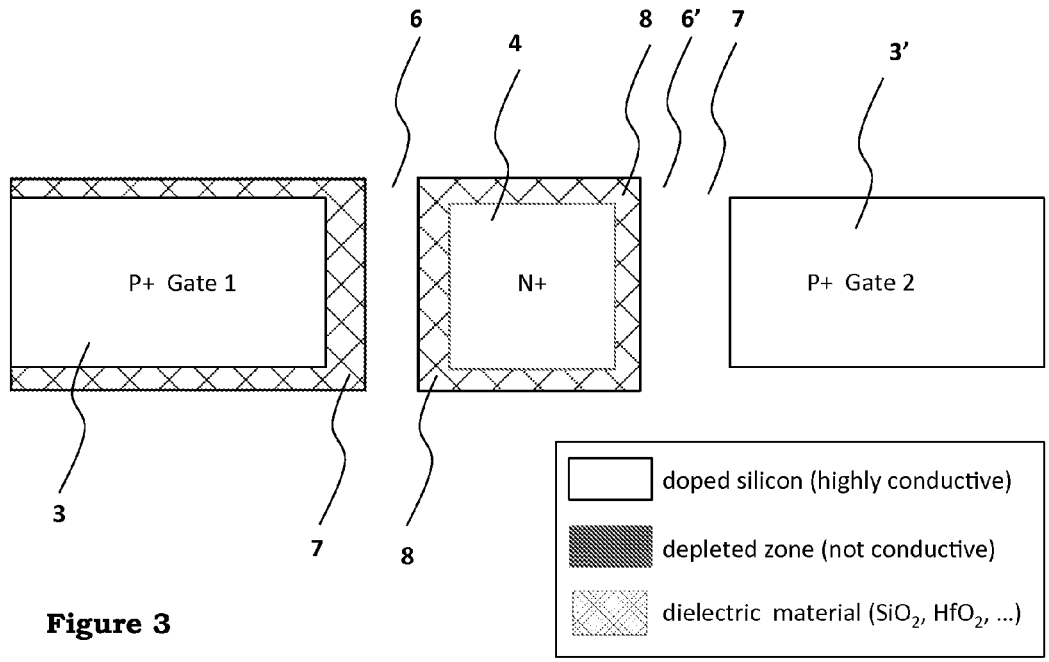
FIG. 3 contains a schematic cross-sectional illustration of a basic operating principle.

In order to address a single device on-chip, flexible 60 nm air-gap capacitors were used to couple two independent gate electrodes with the nanowire resonator (FIG. 2a). The resonators have a typical length between 1 and 2 µm, a total final height of 43 nm and a total final width of 67 nm. The silicon body has a cross-section of 28×35 nm$^2$ (FIG. 2b) and is fully depletable by the action of the gate electrodes (the maximum depletion depth is estimated to be $W_{dep,max}$~25 nm for a given doping concentration of ~2×10$^{18}$ cm$^{-3}$). Looking at the results, it can be seen that the current-voltage characteristics reveal a transistor with a well-behaved transition from the OFF- to the ON-state. In FIG. 3a, the drain current is plotted versus gate voltage, which was applied symmetrically ($V_{G1}=V_{G2}$). The transfer curve shows off-currents corresponding to the noise floor of the measurement system (fA) and on/off current ratios beyond 10$^6$. Clear exponential dependence is observed in sub-threshold, with a resulting sub-threshold slope of 580 mV dec$^{-1}$. FIG. 3b shows the experimental output characteristics, which indicate the linear operating region and the transition to current saturation at higher drain voltages ($V_D$≈1 V).

Figure 4:
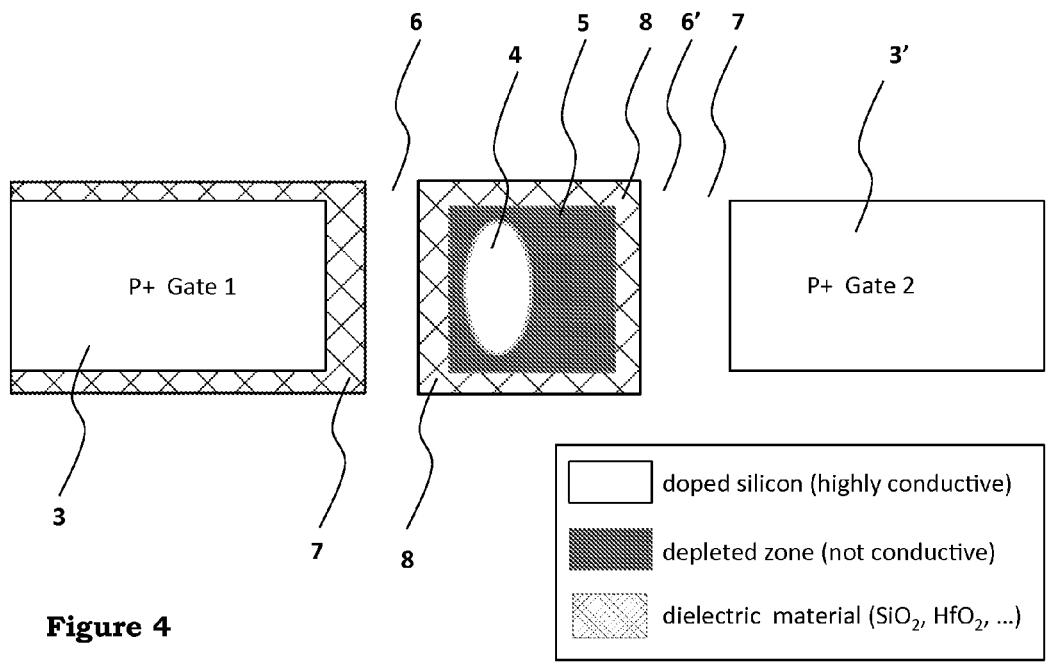
FIG. 4 contains a further schematic cross-sectional illustration of a basic operating principle.
Figure 5:
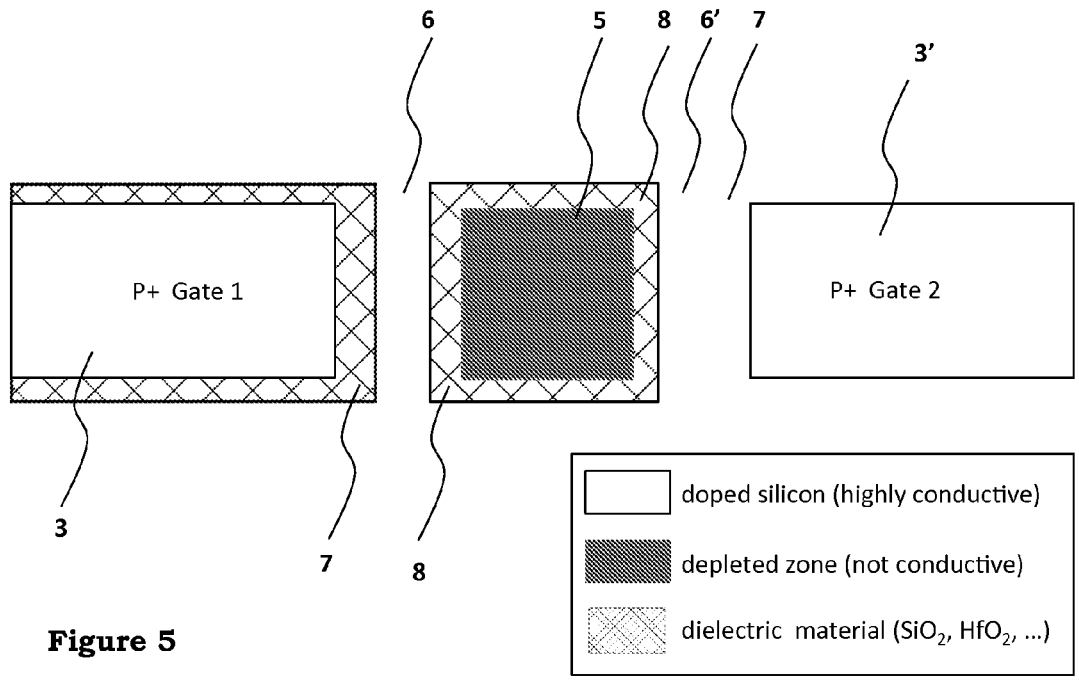
FIG. 5 contains still a further schematic cross-sectional illustration of a basic operating principle.

In our experiment, the full transistor functionality incorporated into the nanowire resonator is exploited to reveal the mechanical resonance. The resonant properties were measured by means of a frequency modulated (FM) actuation scheme,[25] which lends itself to a straightforward experimental implementation. The FET was biased close to the threshold voltage, but with asymmetric gate bias ($V_{G1}=-13$ V; $V_{G2}=+4$ V). The drain current path was thereby concentrated on the outer edge (also indicated in FIG. 1), where we can expect the strongest mechanically induced current modulation, and hence mechanical displacement gain. FIG. 4a shows the mechanical amplitude spectrum of a junctionless nanowire resonator with a length of 1.7 µm and fundamental resonance at 96 MHz, plotted for different gate voltages of $V_{G1}$. Fitting the resonance based on a model considering the FM actuation scheme yielded a quality factor of Q~320, or an f-Q product in the order of 7×10$^{11}$, close to the highest values previously reported in silicon nanowire beam resonators of similar dimensions.[17] We also measured the detected drain current as a function of the gate bias and compared it to the device transconductance. FIG. 4b shows the correlation from the ON-state to channel pinch-off, with an exponential dependence in sub-threshold. This is expected from transistor mixer theory.[21] The input and output power are linearly related, as can be seen in FIG. 4c. We note that with a frequency tunability of $df_0/dV_G$≈0.98 MHz/V, nanowire resonators of this class are excellent candidates for parametric actuation schemes.[26] Furthermore, in contrast to bottom-up fabrication procedures, this approach offers a high degree of freedom, as the mechanical design of the adjacent electrodes can be freely chosen and other modal shapes, such as free-free beams, can be applied to improve performance.[27] FIG. 5 depicts the fundamental resonance at 224 MHz of a 1 µm long device whose frequency is among the highest resonant frequencies measured with silicon nanowire resonators to date.[8,17,28] The resonator has a very small effective mass of 7×10$^{-18}$ kg, a measured Q of ~80 at 1 atm. The mass resolution can be estimated in the attogram range under ambient conditions, based on the practically achievable performance of such resonators demonstrated in previous works.[5,8,14]

Figure 6:
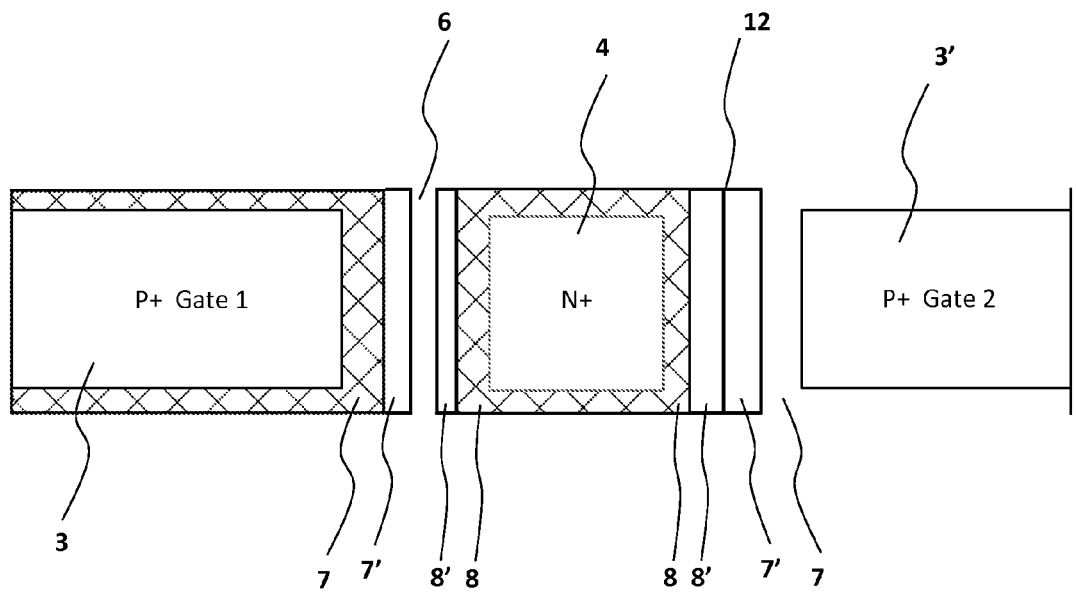
FIG. 6 contains a schematic cross-sectional illustration with more details about possible configurations.
Figure 7:
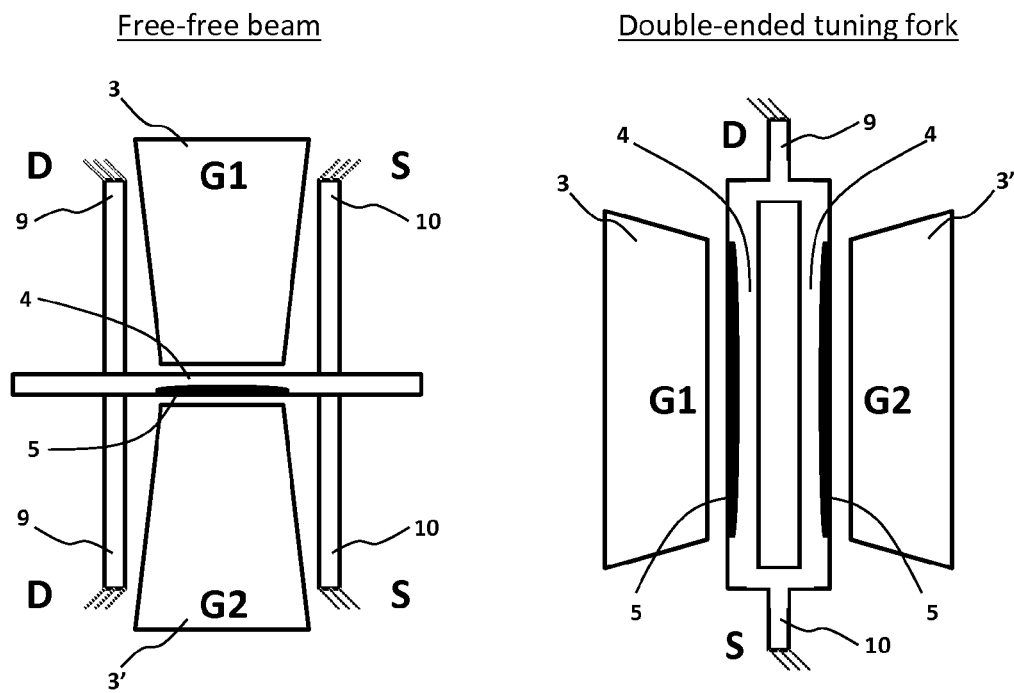
FIG. 7 shows two examples of a modal shape design.
Figure 8:
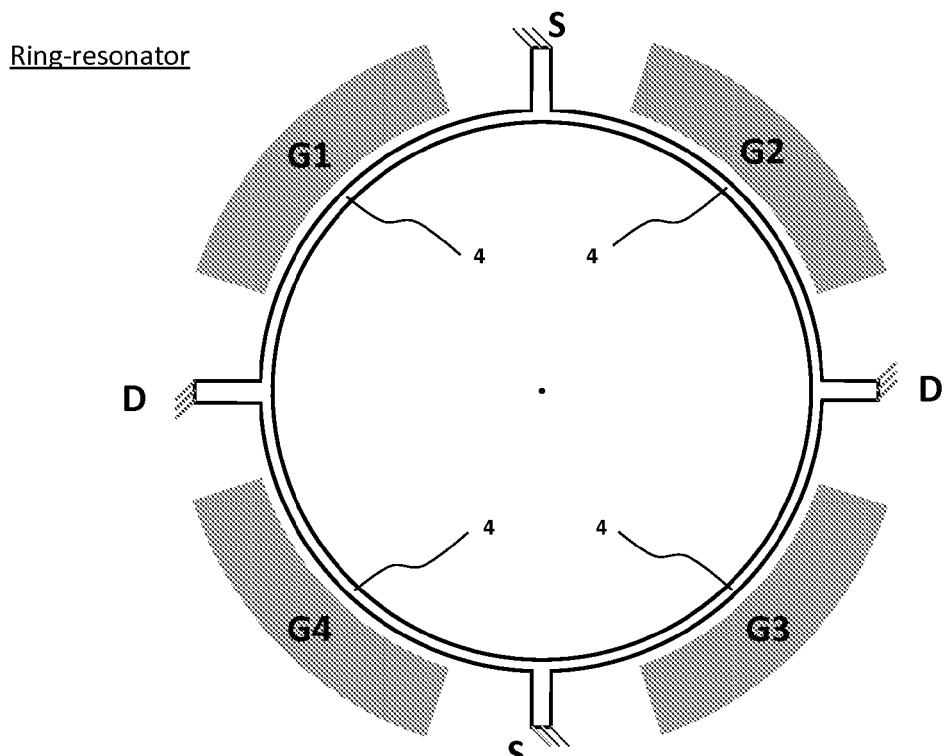
FIG. 8 shows a possible configuration of a junctionless NEM resonator with a number of highly doped conductive channels (4 in this figure) and a number of gate electrodes (4 in this figure)

FIGS. 6 to 8 illustrate the basic operating principle in three steps.

Figure 9:
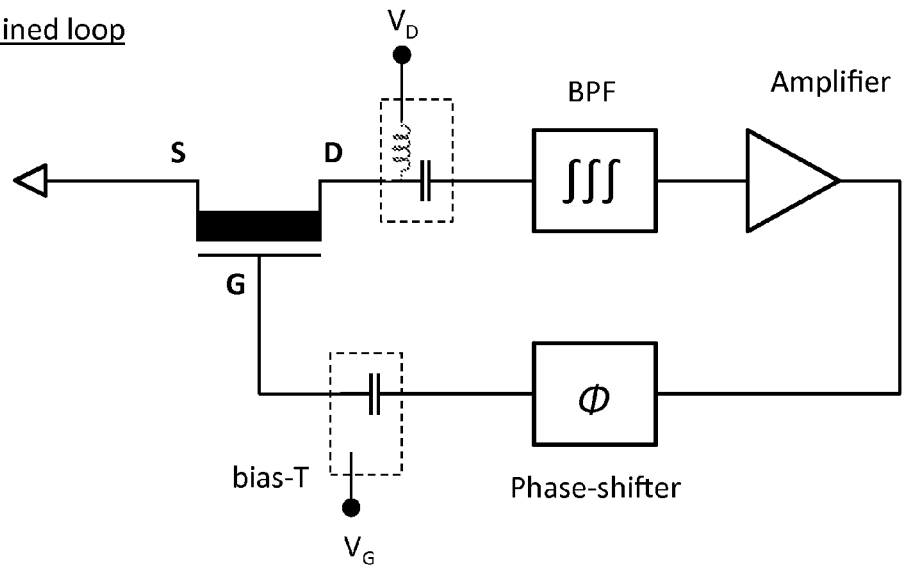
FIG. 9 shows an example of a closed loop implementation.
Figure 10:
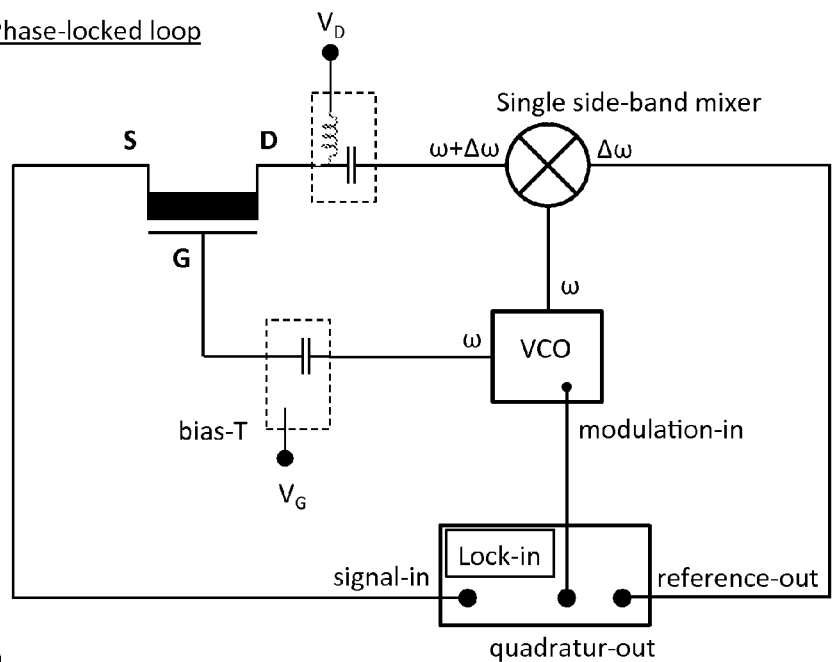
FIG. 10 shows a further example of a closed loop implementation.
Figure 11:
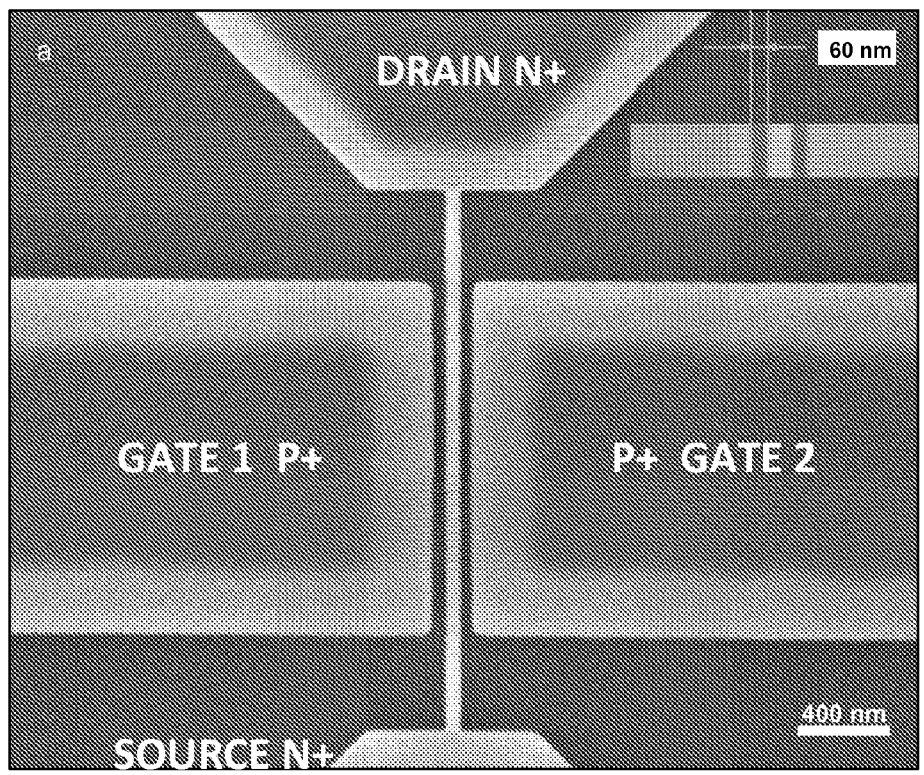
FIG. 11 contains a SEM view of a fabricated flexible air-gap capacitors are used to couple two independent gate electrodes with a nanowire resonator.

FIGS. 9 to 11 illustrate three examples of gate electrode configurations.

Figure 12:
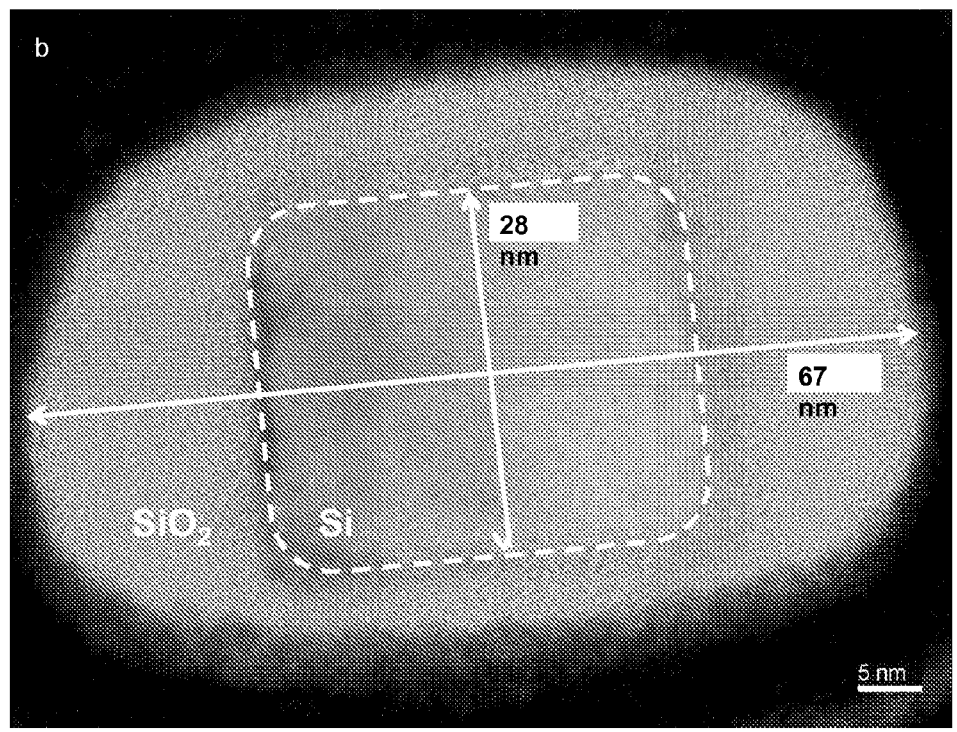
FIG. 12 shows a TEM cross-section of a single silicon body according to an example embodiment of the invention.
Figure 13:
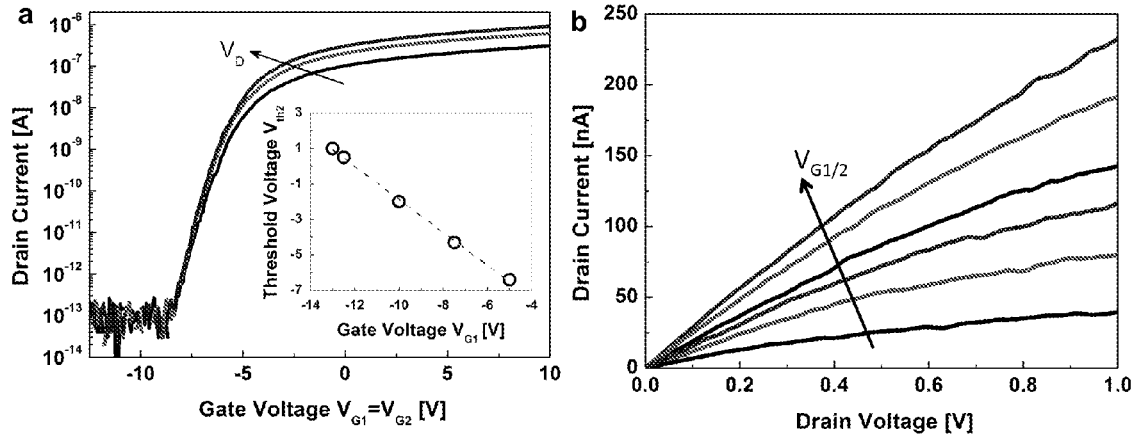
FIGS. 13a and 13b contains plots of static characteristics of a junctionless nano-electromechanical resonator according to an example embodiment of the invention.

FIGS. 12 and 13 illustrate two modal shape designs.

Figure 14:
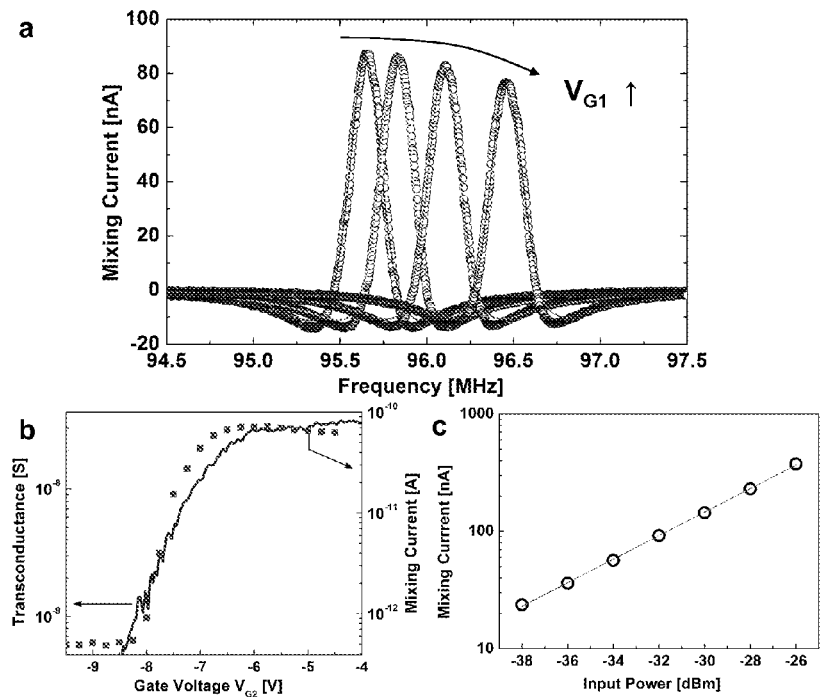
FIG. 14a contains a plot of resonant characteristics of a junctionless nano-electromechanical resonator with 1.7 μm in length.
FIG. 14b show plots of transistor transconductance versus detected current.
FIG. 14c contains a plot of detected current signal versus input power.
Figure 15:
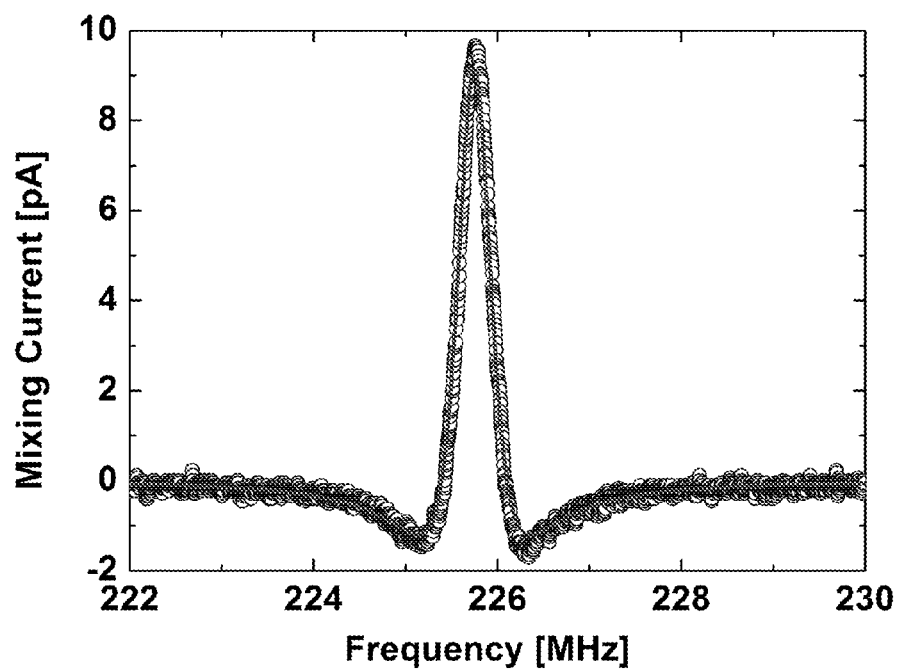
FIG. 15 contains a plot depicting resonant characteristics of a junctionless nano-electromechanical resonator with 1.0 μm in length.
Figure 16:
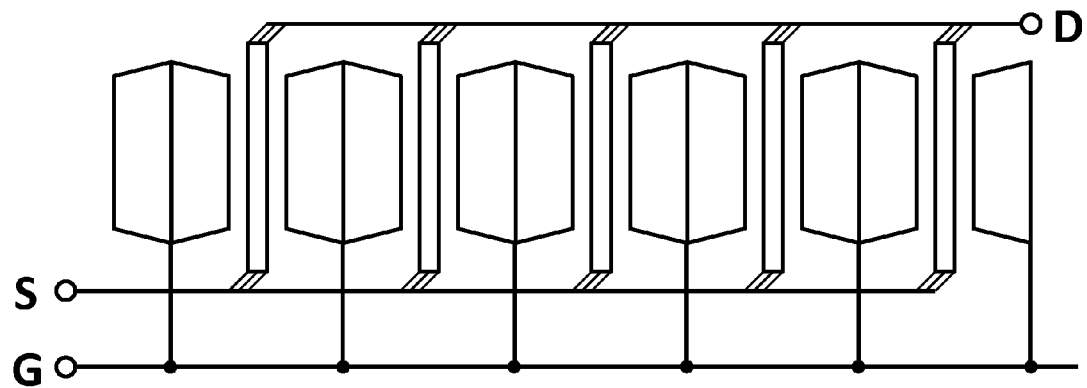
FIG. 16 shows an array of a number of junctionless NEM resonators.

FIGS. 14 and 15 illustrate two closed loop implementations.

In the present application, we have demonstrated the implementation and the unique properties of a self-aligned junctionless silicon nanowire electromechanical FET with two lateral 60 nm air-gap gates. The depletion charge modulation can be harnessed to transduce a mechanical motion at very high frequencies and is suited to a class of very scaled (sub-50 nm) silicon nanowire resonators. In broader terms, our results demonstrate that the concepts and technologies that primarily advance the continued scaling of solid-state FETs can be readily applied to create active, nanomechanical resonators. Interfaced with advanced CMOS on a single silicon chip, these devices can be used in complex collective electromechanical signal processing based on millions of resonant transistors. Such systems with high levels of complexity and low power consumption will enable a wide range of applications, from environmental chemical monitoring[29] to label-free bioanalysis.[30]

Methods

Electrical and Mechanical Measurements.

The devices were measured in a vacuum-probe station by Cascade/Süss Microtech with RF GSG-probes (Süss Microtech) under high vacuum conditions (<1×10$^{-5}$ mbar), using a phase-sensitive lock-in detector by Stanford Research and a RF signal source HP8648D. The device performance as function of pressure was achieved by flooding the chamber progressively with $N_2$ and monitoring the pressure precisely with a Pfeiffer PKR 251 and a SMC ZSE30 gauge. For DC measurements, an Agilent parametric analyzer 4556C was used with the same set-up.

The examples and embodiments illustrated in the present application are examples that should not be construed in a limiting manner and variations are possible within the spirit and scope of the present invention, for example via equivalent means.

Also, the different embodiments described herein may be combined together according to circumstances.

REFERENCES

All Incorporated by Reference in their Entirety in the Present Application

[1] Lassagne, B., Garcia-Sanchez, D., Aguasca, A. Bachtold, A. Ultrasensitive mass sensing with a nanotube electromechanical resonator. Nano Lett 8, 3735-3738 (2008).
[2] Mamin, H. J. Rugar, D. Sub-attonewton force detection at millikelvin temperatures. Appl Phys Lett 79, 3358-3360 (2001).
[3] Li, M., Tang, H. X. Roukes, M. L. Ultra-sensitive NEMS-based cantilevers for sensing, scanned probe and very high-frequency applications. Nat Nanotechnol 2, 114-120 (2007).
[4] Naik, A. K., Hanay, M. S., Hiebert, W. K., Feng, X. L. Roukes, M. L. Towards single-molecule nanomechanical mass spectrometry. Nat Nanotechnol 4, 445-450 (2009).
[5] Ndieyira, J. W., Watari, M., Barrera, A. D., Zhou, D., Vogtli, M. et al Nanomechanical detection of antibiotic mucopeptide binding in a model for superbug drug resistance. Nat Nanotechnol 3, 691-696 (2008).
[6] Roukes, M. L., Feng, X. L., White, C. J. Hajimiri, A. A self-sustaining ultrahigh-frequency nanoelectromechanical oscillator. Nat Nanotechnol 3, 342-346 (2008).
[7] Truitt, P. A., Hertzberg, J. B., Huang, C. C., Ekinci, K. L. Schwab, K. C. Efficient and sensitive capacitive readout of nanomechanical resonator arrays. Nano Lett 7, 120-126 (2007).
[8] Feng, X. L., He, R. R., Yang, P. D. Roukes, M. L. Very high frequency silicon nanowire electromechanical resonators. Nano Lett 7, 1953-1959 (2007).
[9] Sinha, N., Wabiszewski, G. E., Mahameed, R., Felmetsger, V. V., Tanner, S. M. et al Piezoelectric aluminum nitride nanoelectromechanical actuators. Appl Phys Lett 95 (2009).
[10] Li, M., Pernice, W. H. P. Tang, H. X. Broadband all-photonic transduction of nanocantilevers. Nat Nanotechnol 4, 377-382 (2009).
[11] Sazonova, V., Yaish, Y., Ustunel, H., Roundy, D., Arias, T. A. et al A tunable carbon nanotube electromechanical oscillator. Nature 431, 284-287 (2004).
[12] Chen, C. Y., Rosenblatt, S., Bolotin, K. I., Kalb, W., Kim, P. et al Performance of monolayer graphene nanomechanical resonators with electrical readout. Nat Nanotechnol 4, 861-867 (2009).
[13] Ekinci, K. L. Roukes, M. L. Nanoelectromechanical systems. Rev Sci Instrum 76 (2005).
[14] Yang, Y. T., Callegari, C., Feng, X. L., Ekinci, K. L. Roukes, M. L. Zeptogramscale nanomechanical mass sensing. Nano Lett 6, 583-586 (2006).
[15] Arlett, J. L., Myers, E. B. Roukes, M. L. Comparative advantages of mechanical biosensors. Nat Nanotechnol 6, 203-215 (2011).
[16] Rothberg, J. M., Hinz, W., Rearick, T. M., Schultz, J., Mileski, W. et al An integrated semiconductor device enabling non-optical genome sequencing. Nature 475, 348-352 (2011).
[17] He, R. R., Feng, X. L., Roukes, M. L. Yang, P. D. Self-transducing silicon nanowire electromechanical systems at room temperature. Nano Lett 8, 1756-1761 (2008).
[18] Mile, E., Jourdan, G., Bargatin, I., Labarthe, S., Marcoux, C. et al In-plane nanoelectromechanical resonators based on silicon nanowire piezoresistive detection. Nanotechnology 21 (2010).
[19] Colinge, J. P., Lee, C. W., Afzalian, A., Akhavan, N. D., Yan, R. et al Nanowire transistors without junctions. Nat Nanotechnol 5, 225-229 (2010).
[20] Grogg, D. Ionescu, A. M. The vibrating body transistor. IEEE T Electron Dev 58, 2113-2121 (2011).
[21] Bartsch, S. T., Lovera, A., Grogg, D., Ionescu, A. M. Silicon nanomechanical resonators with intrinsic tunable gain and sub-nW power consumption. Nano 84, 1771-1773 (2004).
[22] Abele, N., Fritschi, R., Boucart, K., Casset, F., Ancey, P. et al Suspended-gate MOSFET: Bringing new MEMS functionality into solid-state MOS transistor. Int El Devices Meet, 1075-1077 (2005).
[23] Weinstein, D. Bhave, S. A. The resonant body transistor. Nano Lett 10, 1234-1237 (2010).
[24] Beeby, S Y., Ensell, G., Baker, B. R., Tudor, M. J. White, N. M. Micromachined silicon resonant strain gauges fabricated using SOI wafer technology. J Microelectromech S 9, 104-111 (2000).
[25] Gouttenoire, V., Barois, T., Perisanu, S., Leclercq, J. L., Purcell, S. T. et al Digital and FM demodulation of a doubly clamped single-walled carbon-nanotube oscillator: Towards a nanotube cell phone. Small 6, 1060-1065 (2010).
[26] Eichler, A., Chaste, J., Moser, J. Bachtold, A. Parametric amplification and self-oscillation in a nanotube mechanical resonator. Nano Lett 11, 2699-2703 (2011).
[27] Wang, K., Wong, A. C. Nguyen, C. T. C. VHF free-free beam high-Q micromechanical resonators. J Microelectromech S 9, 347-360 (2000).
[28] Husain, A., Hone, J., Postma, H. W. C., Huang, X. M. H., Drake, T. et al Nanowire-based very-high-frequency electromechanical resonator. Appl Phys Lett 83, 1240-1242 (2003).
[29] Li, M., Myers, E. B., Tang, H. X., Aldridge, S J., McCaig, H. C. et al Nanoelectromechanical resonator arrays for ultrafast, gas-phase chromatographic chemical analysis. Nano Lett 10, 3899-3903 (2010).
[30] Zhang, J., Lang, R P., Huber, F., Bietsch, A., Grange, W. et al Rapid and label-free nanomechanical detection of biomarker transcripts in human RNAv v. Nat Nanotechnol 1, 214-220 (2006).

The invention claimed is:

1. A junctionless Nano-Electro-Mechanical (NEM) resonant transistor, comprising:
a highly doped conductive channel with a doping concentration equal or higher than $2 \times 10^{18}$ donors or acceptors atoms/cm³, forming a device channel that is placed between two other highly doped regions of same type of either donors or acceptors, the two other highly doped regions being called respectively a drain region and a source region, thereby forming a junctionless n+/n+/n+ or p+/p+/p+ structure, whereby two ends of the source region and drain region are mechanically fixed while an overall body of the structure is suspended and movable under the action of an electric field, at least one fixed gate electrode arranged to control a depletion charge in the highly doped conductive channel thereby modulating dimensions of a cross-section of the highly doped conductive channel, together with an electromechanical actuation of the overall body of the structure, whereby the dimension of the cross-section in the direction of an electrical field that is oriented from the fixed gate electrode to the highly doped conductive channel, is designed in such a way that it can be reduced under the effect of the depletion charge such that a partial or a full depletion in the highly doped conductive channel is achievable with the control of the at least one fixed gate electrode.

2. The junctionless NEM resonant transistor of claim 1 wherein the highly doped conductive channel is one out of the following list: a nano-beam, a nano-wire, a nano-plate, a nano-disk, a nano-membrane.

3. The junctionless NEM resonant transistor of claim 1 wherein the highly doped conductive channel or the at least one gate electrode comprises a thermal silicon oxide layer positioned at an interface between the highly doped conductive channel and the at least one fixed gate electrode.

4. The junctionless NEM resonant transistor of claim 3 wherein a volume between the highly doped conductive channel and the at least one fixed gate electrode is partially or totally filled by the thermal silicon oxide layer.

5. The junctionless NEM resonant transistor of claim 1 wherein the highly doped conductive channel and/or the at least one gate comprise a surface that was treated through thermal oxidation for passivation, temperature compensation or functionalization.

6. The junctionless NEM resonant transistor of claim 1 further comprising at least an additional highly doped conductive channel, wherein the highly doped conductive channel and the least one additional highly doped conductive channel are mechanically coupled to each other through elastic fixations.

7. The junctionless NEM resonant transistor of claim 1 wherein the at least one fixed gate electrode gate comprises two fixed gates electrodes arranged to independently couple to the highly doped conductive channel.

8. The junctionless NEM resonant transistor of claim 1 wherein the at least one gate electrode is made of one out of the following list:
   highly doped p+ single crystalline silicon, highly doped p+ and n+ single crystalline silicon, semiconductor material, poly-silicon, metal silicide, aluminum silicide, a metal.

9. The junctionless NEM resonant transistor of claim 1, wherein the dimension of the cross-section in the direction of the electrical field that is oriented from the fixed gate electrode to the highly doped conductive channel, in an absence of a depletion charge is substantially 35 nm.

10. The junctionless NEM resonant transistor of claim 1, wherein the highly doped conductive channel is positioned over a bulk silicon substrate.

11. The junctionless NEM resonant transistor of claim 1, wherein the highly doped conductive channel is positioned over an electrically isolated substrate.

12. A junctionless Nano-Electro-Mechanical (NEM) mixer-filter comprising at least one junctionless NEM resonant transistor of claim 1 wherein a filter shape is given by a mechanical spectrum of the junctionless NEM resonant transistor and wherein the control of the depletion charge in the highly conductive channel generates a current-voltage nonlinearity upon which a mixing of a first signal and a second signals of different frequency is made possible, wherein the first signal (RF) and the second signal (LO) are applied according to
   (i) the first signal (RF) on the gate, the second signal (LO) on the drain (source)
   (ii) the first signal (RF) and the second signal (LO) to the gate,
   and wherein a DC bias at the drain (source) is zero in case of a resistive mixing or non-zero is case of an active mixing.

13. A junctionless Nano-Electro-Mechanical (NEM) frequency demodulator comprising at least one junctionless NEM resonant transistor of claim 1 wherein a frequency-modulated carrier signal is demodulated and a based-band is recovered via a combination of the mechanical spectral response of the NEM resonant transistor with the said depletion-charge induced current-voltage nonlinearity in the highly doped conductive channel.

14. A junctionless Nano-Electro-Mechanical (NEM) resonant transistor phase-locked loop comprising at least one junctionless NEM resonant transistor as claimed in claim 13, wherein the property of the junctionless NEM as mixer-filter or as frequency demodulator is used to generate a negative feedback signal with improved signal-to-noise and to realize a phase-locked loop tracking the NEM mechanical oscillation in real-time.

15. A junctionless Nano-Electro-Mechanical (NEM) electromechanical oscillator comprising at least one junctionless NEM resonant transistor of claim 1, wherein a frequency determining element is given by a junctionless NEM resonant transistor mechanical design, and wherein the gate controls the depletion charge and so the current in the highly conductive channel, thereby generating an intrinsic voltage or transconductance amplification which is used to partially sustain the mechanical oscillation in a self-sustained closed loop configuration, or fully sustain the mechanical oscillation in a self-oscillating configuration.

16. A junctionless Nano-Electro-Mechanical (NEM) resonant transistor sensor comprising at least one junctionless NEM resonant transistor of claim 1, wherein the physical quantity to be measured is displacement, mass, acceleration, torque, heat, temperature, pressure, or else, wherein the dependency on the frequency, the quality factor or the output signal of the junctionless NEM resonant transistor is known, wherein the said intrinsic signal amplification is exploited to enhance the sensor's output signal-to-noise ratio.

* * * * *